United States Patent [19]
Shue

[11] Patent Number: 5,688,718
[45] Date of Patent: Nov. 18, 1997

[54] METHOD OF CVD TIN BARRIER LAYER INTEGRATION

[75] Inventor: Shaulin Shue, Hsinchu, Taiwan

[73] Assignee: Taiwan Semiconductor Manufacturing Company Ltd., Hsin-Chu, Taiwan

[21] Appl. No.: 794,598

[22] Filed: Feb. 3, 1997

[51] Int. Cl.$^6$ .................................................. H01L 21/283
[52] U.S. Cl. ........................... 437/190; 437/192; 437/195
[58] Field of Search .................................. 437/189, 190, 437/192, 195, 228 ST; 257/751, 752, 753, 763

[56] References Cited

U.S. PATENT DOCUMENTS

| | | | |
|---|---|---|---|
| 5,312,775 | 5/1994 | Fujii et al. | 437/192 |
| 5,362,632 | 11/1994 | Mathews | 437/47 |
| 5,378,501 | 1/1995 | Foster et al. | 427/255.2 |
| 5,399,379 | 3/1995 | Sandhu | 427/255.2 |
| 5,407,861 | 4/1995 | Marangon et al. | 437/192 |
| 5,420,070 | 5/1995 | Matsuura et al. | 437/190 |
| 5,521,121 | 5/1996 | Tsai et al. | 437/190 |
| 5,554,563 | 9/1996 | Chu et al. | 437/190 |
| 5,591,672 | 1/1997 | Lee et al. | 437/190 |

FOREIGN PATENT DOCUMENTS

0596634A2  5/1994  European Pat. Off. .

OTHER PUBLICATIONS

Riley, P., et al., "Implementation of Tungsten Metallization . . .", IEEE Trans. Semi. Manuf., vol. 3, No. 4, Nov. 1990, pp. 150–157.

Primary Examiner—T. N. Quach
Attorney, Agent, or Firm—George O. Saile; Stephen B. Ackerman; Rosemary L. S. Pike

[57] ABSTRACT

A method of forming a titanium nitride barrier layer is described. Semiconductor device structures are provided in and on a semiconductor substrate. An insulating layer is deposited overlying the semiconductor device structures. An opening is etched through the insulating layer to contact one of the semiconductor device structures. A titanium glue layer is deposited overlying the insulating layer and within the opening. A titanium nitride barrier layer is deposited overlying the titanium glue layer by chemical vapor deposition. A first metal layer is deposited overlying the barrier layer and filling the opening. The first metal layer is etched back leaving the first metal layer only within the opening whereby a portion of the titanium glue layer is exposed. Thereafter, the substrate is annealed to form a titanium nitride protection layer on the exposed portion of the titanium glue layer. Thereafter, the substrate is cleaned wherein the protection layer prevents oxidation of the titanium glue layer. A second metal layer is deposited overlying the first metal layer and patterned to complete the metallization in the fabrication of an integrated circuit device.

23 Claims, 3 Drawing Sheets

METHOD OF CVD TIN BARRIER LAYER INTEGRATION

BACKGROUND OF THE INVENTION (1) Field of the Invention

The invention relates to a method of barrier layer formation in the fabrication of integrated circuits, and more particularly, to a method of forming an improved titanium nitride barrier layer in the manufacture of integrated circuits.

(2) Description of the Prior Art

In a common application for integrated circuit fabrication, a contact/via opening is etched through an insulating layer to an underlying conductive area to which electrical contact is to be made. A glue layer, typically titanium, is conformally deposited within the contact/via opening. Next, a titanium nitride barrier layer is formed within the contact/via opening. This barrier layer may be deposited by reactive sputtering or by chemical vapor deposition (CVD). As device feature sizes continue to shrink, the CVD method of forming a barrier layer becomes essential. CVD processes are preferred because they can provide conformal layers of any thickness. Thinner barrier layers are preferred because of the shrinking feature sizes. A conducting layer material is deposited within the contact/via opening. Typically, tungsten is deposited and etched back to form a plug filling the contact/via opening. A second conducting layer, such as an aluminum alloy, is deposited overlying the tungsten plug and patterned to complete the metallization. During the etchback process to form the tungsten plug, the thin CVD titanium nitride barrier layer may be etched away, exposing the underlying titanium layer. During the subsequent scrub cleaning step, the exposed titanium underlayer will be oxidized. This will result in difficulty in etching the titanium oxide layer causing metal interconnect shorting due to the residues remaining after etching.

U.S. Pat. No. 5,399,379 to Sandhu discloses a method for forming high-density, highly-conformal titanium nitride films having low bulk resistivity. U.S. Pat. No. 5,378,501 to Foster et al teaches chemical vapor deposition of a titanium nitride film at low temperatures. U.S. Pat. No. 5,362,632 to Mathews teaches forming a titanium nitride layer over a reaction prevention barrier layer formed by a rapid thermal silicon nitride (RTN) process.

SUMMARY OF THE INVENTION

A principal object of the present invention is to provide an effective and very manufacturable method of forming a titanium nitride barrier layer in a metallization process in the fabrication of integrated circuit devices.

Another object of the invention is to provide a method for forming a titanium nitride barrier layer that will prevent oxidation of the underlying titanium layer.

A further object of the invention is to provide a method for forming a titanium nitride barrier layer that will prevent metal interconnect shorting.

In accordance with the objects of this invention a new method of forming a titanium nitride barrier layer is achieved. Semiconductor device structures are provided in and on a semiconductor substrate. An insulating layer is deposited overlying the semiconductor device structures. An opening is etched through the insulating layer to contact one of the semiconductor device structures. A titanium glue layer is deposited overlying the insulating layer and within the opening. A titanium nitride barrier layer is deposited overlying the titanium glue layer by chemical vapor deposition. A first metal layer is deposited overlying the barrier layer and filling the opening. The first metal layer is etched back leaving the first metal layer only within the opening whereby a portion of the titanium glue layer is exposed. Thereafter, the substrate is annealed to form a titanium nitride protection layer on the exposed portion of the titanium glue layer. Thereafter, the substrate is cleaned wherein the protection layer prevents oxidation of the titanium glue layer. A second metal layer is deposited overlying the first metal layer and patterned to complete the metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
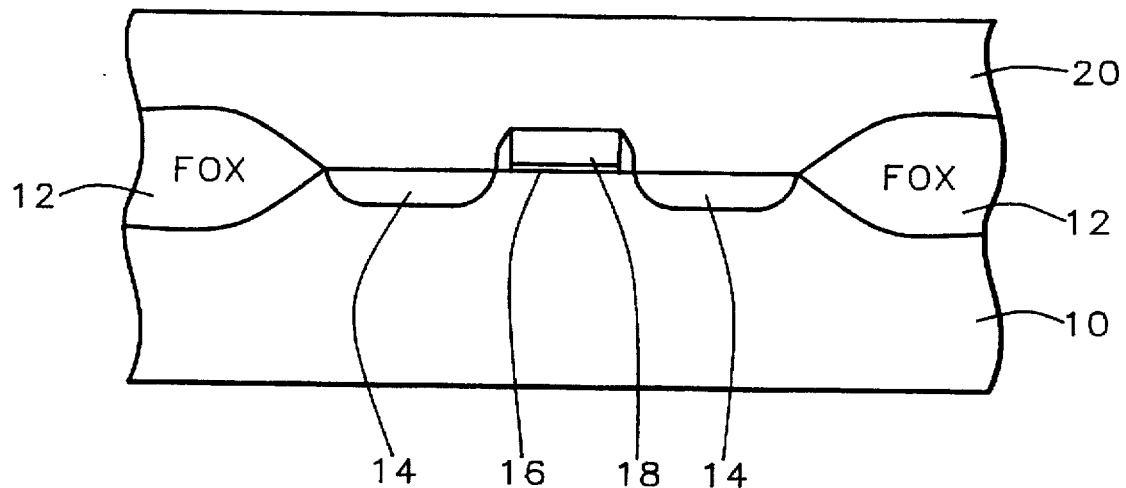
FIGS. 1, 2, 3, and 5 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures are formed in and on the semiconductor substrate. For example, source/drain regions 14 are formed as is understood in the art either before or after formation of the gate electrode 18 overlying gate silicon oxide layer 16. Field OXide regions 12 separate the semiconductor device structures from other such structures, not shown.

An insulating layer 20, composed of borophosphosilicate glass (BPSG), borosilicate glass (BSG), or phosphosilicate glass (PSG), or the like is deposited over the surface of the semiconductor structures to a thickness of between about 5000 to 9000 Angstroms and preferably planarized.

Figure 2:
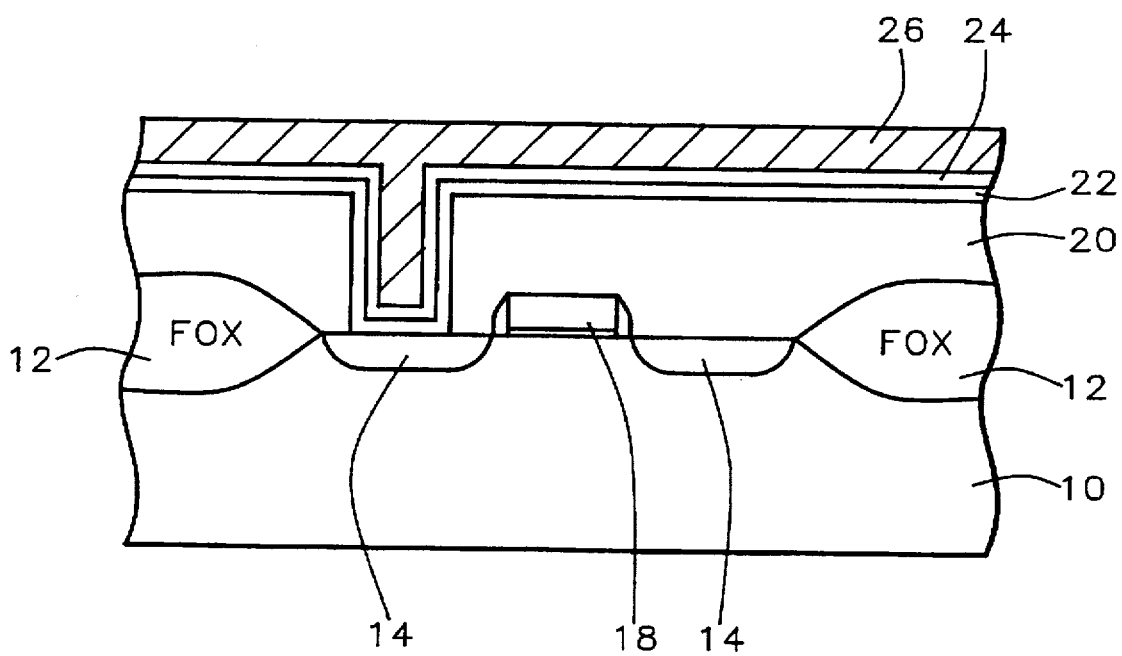

Referring now to FIG. 2, a contact/via opening is etched through the insulating layer 20 to the source/drain region 14 within the semiconductor substrate. A titanium glue layer 22 is deposited conformally over the surface of the insulating layer 20 and within the contact/via opening to a thickness of between about 100 and 400 Angstroms.

Next, a layer of titanium nitride 24 is deposited by chemical vapor deposition (CVD) over the titanium layer 22 and within the contact/via opening. This layer 24 forms a barrier layer. Because CVD is used rather than a physical vapor deposition method (PVD) such as sputtering, a thinner titanium nitride layer can be formed. The titanium nitride barrier layer 24 has a thickness of between about 50 and 400 Angstroms. The titanium nitride precursors could be $TiCl_4$ and $Ti(N-R_2)_4$ Tetrakis-dialkylamido titanium.

Since PVD titanium nitride forms a column structure, subsequent $WF_6$ deposition to form the tungsten plug could diffuse through the titanium nitride grain boundaries and attack the titanium underlayer. Because of this, a prior art process performs a rapid thermal nitride process (RTN) at this point. However, in the process of the present invention, CVD titanium nitride is a microcrystalline structure. It is not easy for tungsten to diffuse through the CVD titanium nitride to attack the titanium underlayer, so the RTN process is not yet performed.

Figure 3:
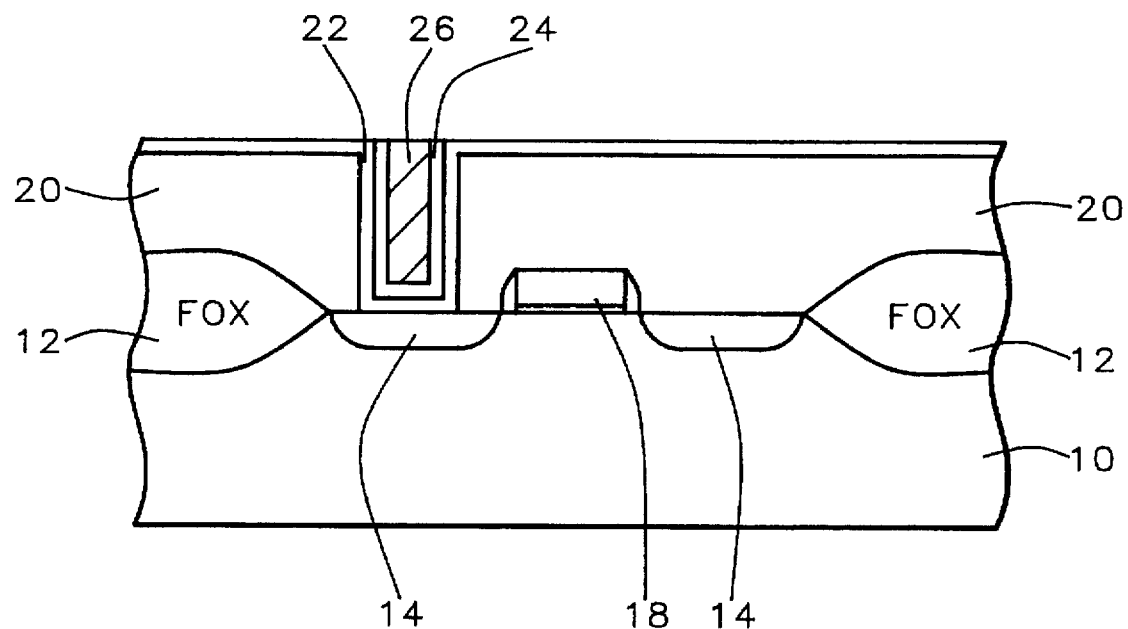

A layer of tungsten 26 is deposited by low pressure chemical vapor deposition (LPCVD) over the barrier layer 24 to fill the contact/via opening. The tungsten is etched back to leave a tungsten plug filling the contact/via opening as shown in FIG. 3. During the etching back process, the CVD titanium nitride layer 24 not within the contact/via opening is etched away since it is thinner than PVD titanium nitride. The titanium underlayer 22 is exposed.

Figure 4A:
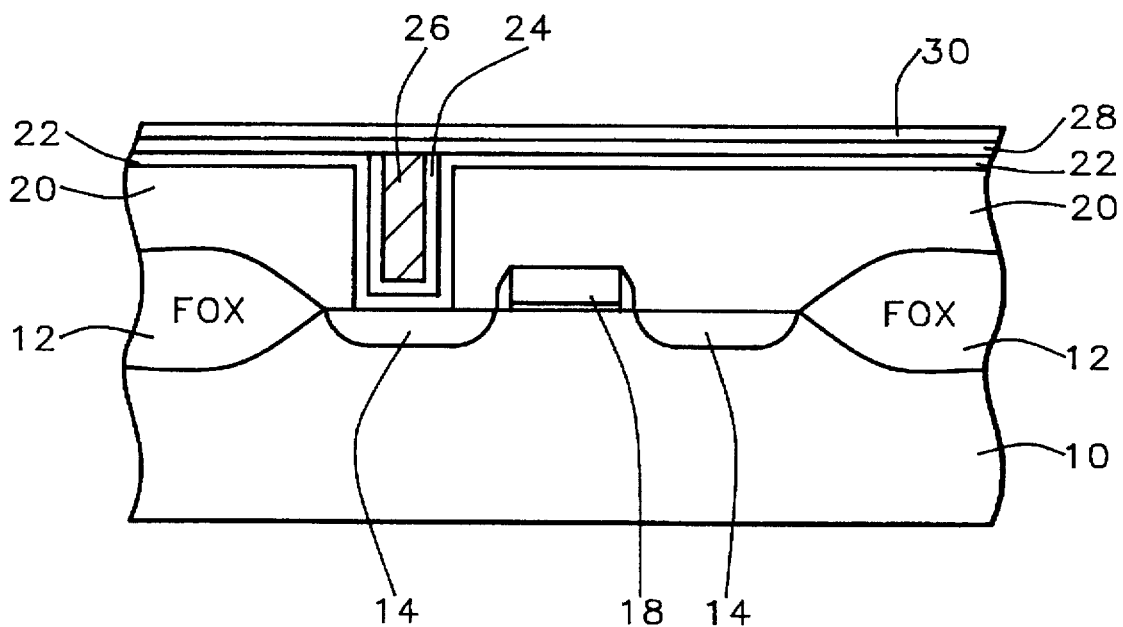
FIGS. 4A and 4B schematically illustrate in cross-sectional representation two alternatives in an embodiment of the present invention.

Referring now to FIG. 4A, a second layer of titanium 28 may be deposited by PVD to a thickness of between about 100 and 300 Angstroms over the surface of the substrate after the tungsten etchback. This is an optional step.

Figure 4B:
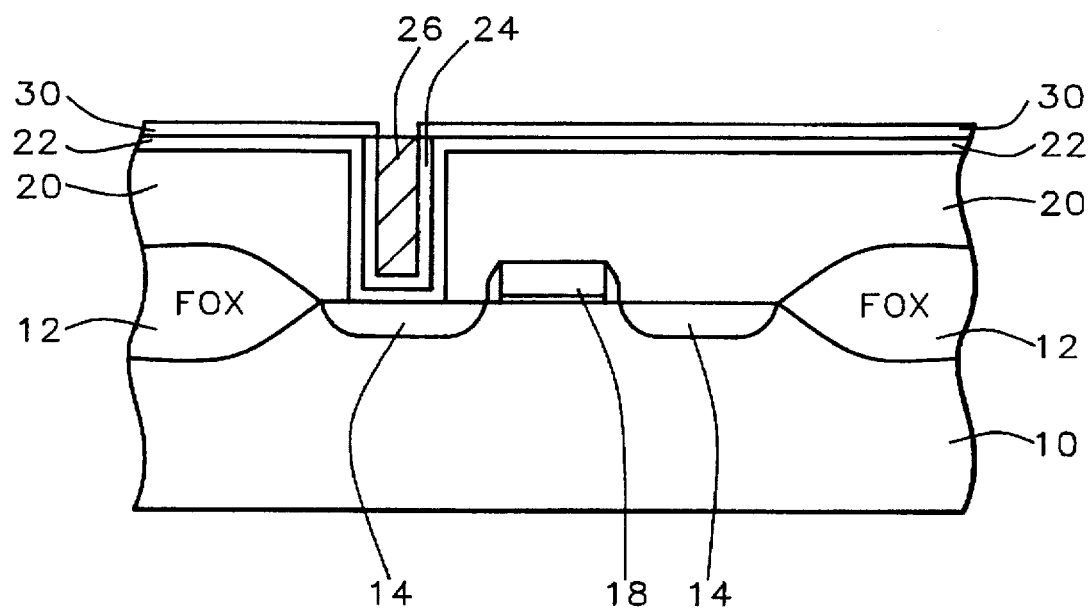

A single rapid thermal annealing (RTA) step is used to produce a thin titanium nitride protection layer 30 on the exposed titanium layer 22, as shown in FIG. 4B, or on the second titanium layer 28, as shown in FIG. 4A.

The RTA is performed by flowing $N_2$ gas at a temperature of between about 550° and 900° C. for a duration of between about 20 and 120 seconds. Preferably, the temperature is between about 600° and 700° C. and the duration is between about 30 and 90 seconds.

The following scrub clean step will not cause oxidation of the titanium layer because of the presence of the titanium nitride protection layer 30.

Figure 5:
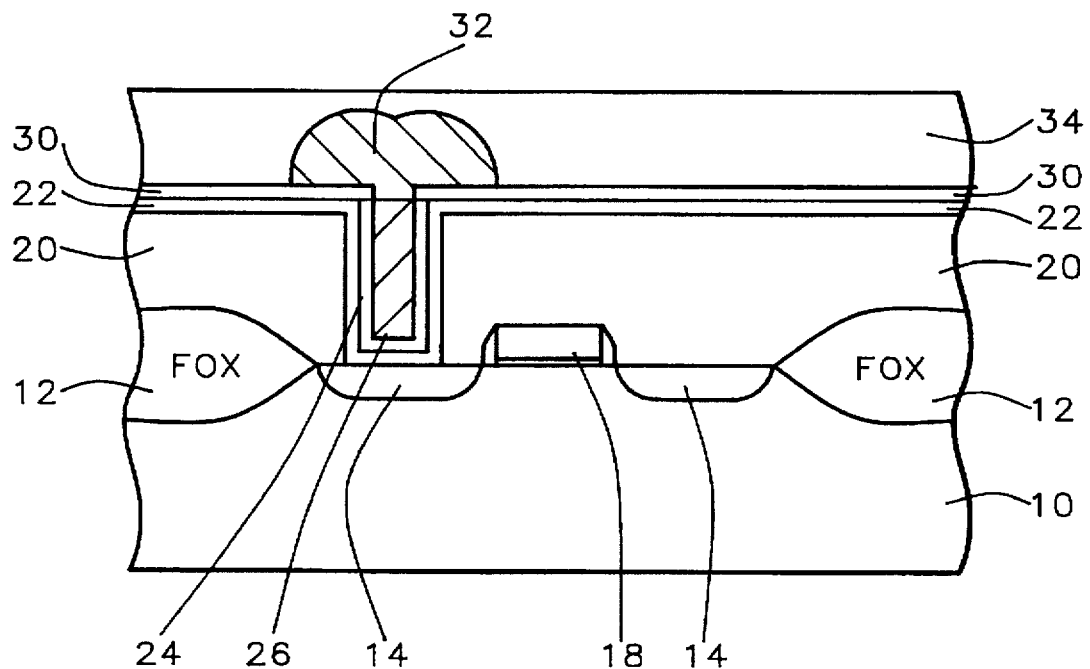

Processing continues as is conventional in the art with metal deposition and patterning. FIG. 5 shows a patterned metal layer 32, such as aluminum and an intermetal dielectric layer 34. Further levels of tungsten plugs and metallization can be fabricated using the barrier layer process of the present invention.

The process of the invention results in a reduction of defects, elimination of titanium surface damage after tungsten etchback, elimination of titanium oxidation after etchback, and improved throughput and yield. These advantages are achieved with no additional required processing steps and with the extra advantage of a thinner CVD titanium nitride barrier layer than in the prior art. In the process of the present invention, the RTA step is not required after deposition of the titanium nitride barrier layer because of the microcrystalline structure of the CVD titanium nitride. In the present invention, the RTA step is moved to follow the tungsten etchback so that the exposed titanium glue layer is protected.

While the invention has been particularly shown and described with reference to the preferred embodiments thereof, it will be understood by those skilled in the art that various changes in form and details may be made without departing from the spirit and scope of the invention.

What is claimed is:

1. A method of metallization in the fabrication of an integrated circuit device comprising:

providing semiconductor device structures in and on a semiconductor substrate;

depositing an insulating layer overlying said semiconductor device structures;

etching an opening through said insulating layer to contact one of said semiconductor device structures;

depositing a glue layer overlying said insulating layer and within said opening;

depositing a barrier layer overlying said glue layer by chemical vapor deposition;

depositing a first metal layer overlying said barrier layer and filling said opening;

etching back said first metal layer to leave said first metal layer only within said opening whereby a portion of said glue layer is exposed;

thereafter annealing said substrate to form a protection layer on said exposed portion of said glue layer;

thereafter cleaning said substrate wherein said protection layer prevents oxidation of said glue layer; and depositing a second metal layer overlying said first metal layer and patterning said second metal layer to complete said metallization in the fabrication of said integrated circuit device.

2. The method according to claim 1 wherein said semiconductor device structures include gate electrodes and source/drain regions and wherein said one of said semiconductor device structures contacted is a source/drain region.

3. The method according to claim 1 wherein said glue layer comprises titanium and has a thickness of between about 100 and 400 Angstroms.

4. The method according to claim 1 wherein said barrier layer comprises titanium nitride and has a thickness of between about 50 and 400 Angstroms.

5. The method according to claim 4 wherein said titanium nitride barrier layer is deposited by chemical vapor deposition (CVD).

6. The method according to claim 1 wherein said annealing is a rapid thermal annealing performed by flowing nitrogen gas at a temperature of between about 550° and 900° C. for a duration of between about 20 to 120 seconds.

7. The method according to claim 1 wherein said annealing is a rapid thermal annealing performed by flowing nitrogen gas at a temperature of between about 600° and 700° C. for a duration of between about 30 to 90 seconds.

8. The method according to claim 1 wherein said first metal layer comprises tungsten and said second metal layer comprises aluminum.

9. A method of metallization in the fabrication of an integrated circuit device comprising:

providing semiconductor device structures in and on a semiconductor substrate;

depositing an insulating layer overlying said semiconductor device structures;

etching an opening through said insulating layer to contact one of said semiconductor device structures;

depositing a titanium glue layer overlying said insulating layer and within said opening;

depositing a titanium nitride barrier layer overlying said titanium glue layer by chemical vapor deposition;

depositing a first metal layer overlying said barrier layer and filling said opening;

etching back said first metal layer to leave said first metal layer only within said opening whereby a portion of said titanium glue layer is exposed;

thereafter annealing said substrate to form a titanium nitride protection layer on said exposed portion of said titanium glue layer;

thereafter cleaning said substrate wherein said protection layer prevents oxidation of said titanium glue layer; and depositing a second metal layer overlying said first metal layer and patterning said second metal layer to complete said metallization in the fabrication of said integrated circuit device.

10. The method according to claim 9 wherein said semiconductor device structures include gate electrodes and source/drain regions and wherein said one of said semiconductor device structures contacted is a source/drain region.

11. The method according to claim 9 wherein said titanium glue layer has a thickness of between about 100 and 400 Angstroms.

12. The method according to claim 9 wherein said titanium nitride barrier layer has a thickness of between about 50 and 400 Angstroms.

13. The method according to claim 9 wherein said annealing is a rapid thermal annealing performed by flowing nitrogen gas at a temperature of between about 550° and 900° C. for a duration of between about 20 to 120 seconds.

14. The method according to claim 9 wherein said annealing is a rapid thermal annealing performed by flowing nitrogen gas at a temperature of between about 600° and 700° C. for a duration of between about 30 to 90 seconds.

15. The method according to claim 9 wherein said first metal layer comprises tungsten and said second metal layer comprises aluminum.

16. A method of metallization in the fabrication of an integrated circuit device comprising:

providing semiconductor device structures in and on a semiconductor substrate;

depositing an insulating layer overlying said semiconductor device structures;

etching an opening through said insulating layer to contact one of said semiconductor device structures;

depositing a first titanium glue layer overlying said insulating layer and within said opening;

depositing a titanium nitride barrier layer overlying said first titanium glue layer by chemical vapor deposition;

depositing a first metal layer overlying said barrier layer and filling said opening;

etching back said first metal layer to leave said first metal layer only within said opening whereby a portion of said first titanium glue layer is exposed;

depositing a second titanium layer overlying said exposed first titanium glue layer;

thereafter annealing said substrate to form a titanium nitride protection layer on said second titanium glue layer;

thereafter cleaning said substrate wherein said protection layer prevents oxidation of said first and second titanium glue layers; and depositing a second metal layer overlying said first metal layer and patterning said second metal layer to complete said metallization in the fabrication of said integrated circuit device.

17. The method according to claim 16 wherein said semiconductor device structures include gate electrodes and source/drain regions and wherein said one of said semiconductor device structures contacted is a source/drain region.

18. The method according to claim 16 wherein said first titanium glue layer has a thickness of between about 100 and 400 Angstroms.

19. The method according to claim 16 wherein said titanium nitride barrier layer has a thickness of between about 50 and 400 Angstroms.

20. The method according to claim 16 wherein said second titanium glue layer has a thickness of between about 100 and 300 Angstroms.

21. The method according to claim 16 wherein said annealing is a rapid thermal annealing performed by flowing nitrogen gas at a temperature of between about 550° and 900° C. for a duration of between about 20 to 120 seconds.

22. The method according to claim 16 wherein said annealing is a rapid thermal annealing performed by flowing nitrogen gas at a temperature of between about 600° and 700° C. for a duration of between about 30 to 90 seconds.

23. The method according to claim 16 wherein said first metal layer comprises tungsten and said second metal layer comprises aluminum.

\* \* \* \* \*